United States Patent
Magee et al.

(10) Patent No.: US 7,454,303 B2
(45) Date of Patent: Nov. 18, 2008

(54) SYSTEM AND METHOD FOR COMPENSATING FOR PVT VARIATION EFFECTS ON THE DELAY LINE OF A CLOCK SIGNAL

(75) Inventors: Terence Magee, San Francisco, CA (US); Thomas Hughes, San Francisco, CA (US); Cheng-Gang Kong, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/643,492

(22) Filed: Dec. 21, 2006

(65) Prior Publication Data

US 2008/0150610 A1   Jun. 26, 2008

(51) Int. Cl.
*G06F 3/00* (2006.01)
(52) U.S. Cl. ............... 702/89; 702/90; 702/182; 702/183
(58) Field of Classification Search ............... 702/79, 702/117, 118, 121, 125, 182, 89, 90; 370/236, 370/388; 455/422; 716/2; 365/193
See application file for complete search history.

(56) References Cited

U.S. PATENT DOCUMENTS

| | | | | |
|---|---|---|---|---|
| 5,949,778 A * | 9/1999 | Abu-Amara et al. | ....... | 370/388 |
| 5,953,318 A * | 9/1999 | Nattkemper et al. | ....... | 370/236 |
| 6,084,865 A * | 7/2000 | Dent | ....... | 370/321 |
| 6,108,394 A * | 8/2000 | Dilbeck | ....... | 377/67 |
| 2005/0155001 A1 * | 7/2005 | Kinoshita et al. | ....... | 716/2 |

* cited by examiner

*Primary Examiner*—Eliseo Ramos-Feliciano
*Assistant Examiner*—Felix Suarez
(74) *Attorney, Agent, or Firm*—Suiter Swantz PC LLO

(57) ABSTRACT

The present invention is directed to a method for compensating for process, voltage, and temperature variation without complex online/offline swapping of data paths requiring a dedicated FIFO(First-in First-out) buffer design. Delay cells are trained for each clock path (namely a Functional delay) and a spare delay cell is trained. A ratio is calculated for each Functional delay cell by dividing the Functional delay cells' setting into the spare delay cells' one-fourth cycle setting. These ratios reflect any process variation. Functional mode is then entered and a Master-Slave approach switched to, during which the spare delay cell repeats the training sequence continuously while the Functional delay cells delay the clocks from the RAM(Random Access Memory). Each Functional delay cell is updated at the end of each training sequence of the spare delay cell, compensating for voltage and temperature change, by dividing the ratio into the new spare delay cell one-fourth cycle setting.

21 Claims, 2 Drawing Sheets

SYSTEM AND METHOD FOR COMPENSATING FOR PVT VARIATION EFFECTS ON THE DELAY LINE OF A CLOCK SIGNAL

FIELD OF THE INVENTION

The present invention relates to the field of electronic data storage and particularly to a system and method for providing process, voltage, and temperature compensation.

BACKGROUND OF THE INVENTION

A read path of a RAM (Random-access Memory) device may require a delay to be added to a clock path to strobe data in the center of an eye pattern. The delay of the clock relative to the arrival time of the data at the sampling point may be subject to process, voltage and temperature (PVT) variation, which may limit the speed of read operations. A method may be utilized for first removing process variation. Further updates may be applied to remove voltage variation and temperature variation.

Current solutions may utilize a Master delay cell to emulate a correct delay setting. The correct delay setting may then be applied to Slave delay cells within the actual clock path. The Master delay cell may then be monitored for voltage and temperature changes, corrected for said changes, and the Slave delay cells updated with the new setting. However, the current solutions may introduce mapping errors due to on-chip process variation from the Master to Slave delays. Further, the current solutions may require that data flow be interrupted in order to update the Slave delay cells. In addition, the currently implemented Master-to-Slave systems do not account for internal skew across multiple data paths which are strobed with a single clock. Still further, the currently implemented Master-to-Slave systems may have stringent duty cycle requirements. Also, current solutions may require custom-designed delay cells for reducing mapping error and may further require custom-designed overhead delay cells for accurately delaying data paths to match the clock path delay cell when the clock path delay cell is set to its minimum delay setting.

Another solution is described in co-pending and commonly owned patent application Ser. No. 11/523,139 (filed Sep. 19, 2006), which is incorporated by reference. Patent application Ser. No. 11/523,139 discloses a method which includes configuring an offline data path to match an online data path. The method further includes compensating the offline data path for voltage and temperature variation. The method further includes swapping the offline data path with the online data path. Further, swapping occurs automatically without interruption of data flow along the data paths. However, this method does not support passing of the strobed data directly to a standard FIFO (first-in first-out) buffer that is common in memory controllers. Instead, this solution is tied to the FIFO design described in paragraph [0017] of patent application Ser. No. 11/523,139. This FIFO design is specific to patent application Ser. No. 11/523,139 and wilt not always be desirable in all memory controller designs.

Therefore, it may be desirable to have a system and method for providing process, voltage and temperature compensation which addresses the above-referenced problems and limitations of the current solutions.

SUMMARY OF THE INVENTION

Accordingly, an embodiment of the present invention is directed to a method for process, voltage, and temperature compensation. The method includes training a programmable delay cell for each clock path (namely a Functional delay) and training a programmable spare delay cell in similar method to the training described in patent application Ser. No. 11/523, 139. The method further includes calculating a ratio for each Functional delay cell by dividing the Functional delay cells' delay setting into the spare delay cells' one-fourth cycle delay (see application Ser No. 11/523,139) setting. A ratio value other than 1.0 reflects any difference between each delay cell and the spare delay cell. This difference may be due to the effect of Process variation plus any intentional deviation of each functional delay from a ¼ cycle delay. The method further includes entering a functional mode and switching to a Master-Slave approach. During functional mode the spare delay cell may repeat the training sequence continuously while the Functional delay cells delay the clocks from the RAM (Random Access Memory) in order to correctly strobe the data. The method further includes updating each Functional delay cell at the end of each training sequence of the spare delay cell during functional mode to compensate for voltage and temperature change by dividing the Functional delay cell's ratio into the new spare delay cells' one-fourth cycle delay setting and updating the Functional delay cell's settings based on the result.

The present invention is a unique cross between the method disclosed in patent application Ser. No. 11/523,139 and the Master-Slave approach, uniquely utilizing ratios to facilitate this merger. The present invention compensates for process variation by training each delay cell individually during initial training and compensates for future voltage and temperature variation by switching to employ a Master-Slave approach. The Master-Slave approach employed by the present invention preserves any process variation information in the ratios and factors these ratios against the Master delay cell setting when utilizing it to update the Slave delay cells.

The present invention utilizes the advantages of the Master-Slave and Data-path switching approaches without suffering from any of the disadvantages. The present invention provides a method for compensating for process, voltage, and temperature variation without complex online/offline swapping of data paths which require a dedicated FIFO (First-in First-out) buffer design. The present invention does not require an embedded FIFO and can therefore interface to standard FIFO designs used in most memory controllers.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the present invention, examples of which are illustrated in the accompanying drawings.

Figure 1:
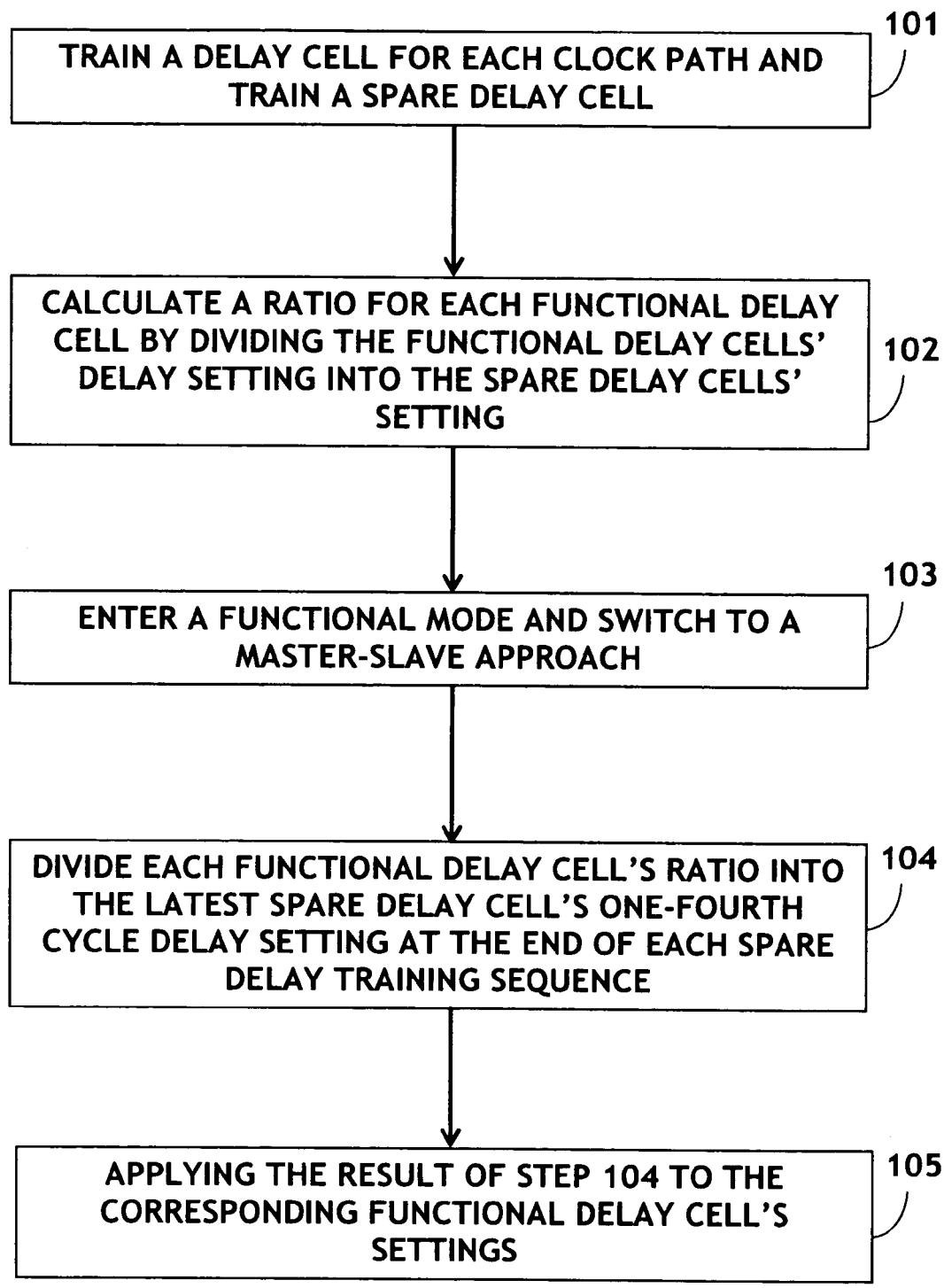
FIG. 1 illustrates a method for process, voltage, and temperature compensation in accordance with an exemplary embodiment of the present invention.

Referring to FIG. 1, a method 100 for process, voltage, and temperature compensation in accordance with an exemplary embodiment of the present invention is shown. The method 100 includes the step 101 of training a delay cell for each clock path (namely a Functional delay) and training a spare delay cell in similar method to the training described in patent application Ser. No. 11/523,139. The method includes training each delay cell in parallel. Training a delay cell may include adding an offset delay to the determined aligned or ¼ delay settings The method 100 further includes the step 102 of calculating a ratio for each Functional delay cell by dividing the Functional delay cells' delay setting into the spare delay cells' one-fourth cycle setting. A ratio value other than 1.0 reflects any difference between each delay cell and the spare delay cell. This difference may be due to the effect of Process variation plus any intentional deviation of each functional delay from a ¼ cycle delay. An intentional deviation includes using the align delay setting as opposed to the ¼ delay setting, and any offsets which are applied. The method 100 further includes the step 103 of entering a functional mode and switching to a Master-Slave approach. During functional mode the spare delay cell may repeat the training sequence continuously while the Functional delay cells delay the clocks from the RAM (Random Access Memory) in order to correctly strobe the data. The delay achieved may be a ¼ cycle delay. The Functional delay cells may be delay cells which can update their delay setting without creating glitches on a clock passing through. The method 100 further includes the step 104 at the end of each spare delay training sequence of dividing each Functional delay cell's ratio into the latest spare delay cell's ¼ cycle delay setting. The method further includes step 105 of applying the result of step 104 to the corresponding Functional delay cell's settings.

Figure 2:
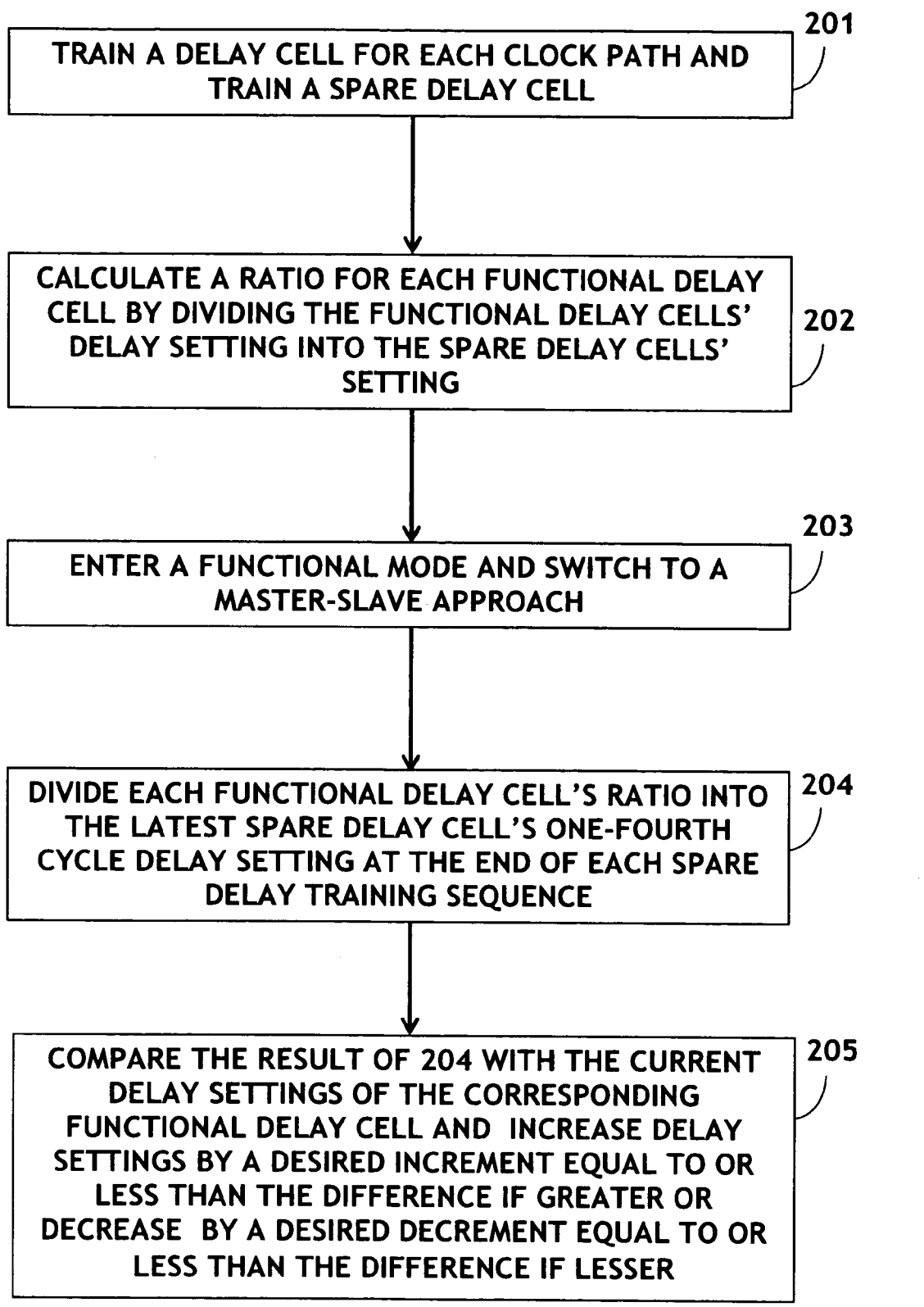
FIG. 2 illustrates a method for process, voltage, and temperature compensation in accordance with an alternative embodiment of the present invention.

Referring to FIG. 2, a method 200 for process, voltage, and temperature compensation in accordance with an exemplary embodiment of the present invention is shown. The method 200 includes the step 201 of training a delay cell for each clock path (namely a Functional delay) and training a spare delay cell in similar method to the training described in patent application Ser. No. 11/523,139. The method includes training each delay cell in parallel. Training a delay cell may include adding an offset delay to the determined aligned or ¼ delay settings The method 100 further includes the step 102 of calculating a ratio for each Functional delay cell by dividing the Functional delay cells' delay setting into the spare delay cells' one-fourth cycle setting. A ratio value other than 1.0 reflects any difference between each delay cell and the spare delay cell. This difference may be due to the effect of Process variation plus any intentional deviation of each functional delay from a ¼ cycle delay. An intentional deviation includes using the align delay setting as opposed to the ¼ delay setting, and any offsets which are applied. The method 100 further includes the step 103 of entering a functional mode and switching to a Master-Slave approach. During functional mode the spare delay cell may repeat the training sequence continuously while the Functional delay cells delay the clocks from the RAM (Random Access Memory) in order to correctly strobe the data. The delay achieved may be a ¼ cycle delay. The Functional delay cells may be delay cells which can update their delay setting without creating glitches on a clock passing through. The method 200 further includes the step 204 at the end of each spare delay training sequence of dividing each Functional delay cell's ratio into the latest spare delay cell's one-fourth cycle delay setting. The method further includes step 205 of comparing the result of 204 with the current delay settings of the corresponding Functional delay cell. If the result of 204 is greater than the delay cell's settings, the delay settings can be increased by a desired increment equal to or less than the difference. If the result of 204 is less than the delay cell's settings, the delay settings can be decreased by a desired decrement equal to or less than the difference.

The present invention is a unique cross between the method disclosed in patent application Ser. No. 11/523,139 and the Master-Slave approach, uniquely utilizing ratios to facilitate this merger. The present invention compensates for process variation by training each delay cell individually during initial training and compensates for future voltage and temperature variation by switching to employ a Master-Slave approach. The Master-Slave approach employed by the present invention preserves any process variation information or/and intentional delay variation in the ratios and factors these ratios against the Master delay cell setting when utilizing it to update the Slave delay cells.

The present invention utilizes the advantages of the Master-Slave and Data-path switching approaches without suffering from any of the disadvantages. The present invention provides a method for compensating for process, voltage, and temperature variation without complex online/offline swapping of data paths which require a dedicated FIFO (First-in First-out) buffer design. The present invention does not require an embedded FIFO and can therefore interface to standard FIFO designs used in most memory controllers.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for process, voltage, and temperature compensation, comprising:
   training at least one functional delay cell for a clock path which has a delay setting and training a spare delay cell which has a one-fourth cycle delay setting;
   calculating a ratio for the at least one functional delay cell by dividing the at least one functional delay cells' delay setting into the spare delay cells' one-fourth cycle delay setting;
   entering a functional mode and switching to a Master-Slave approach.

2. The method as claimed in claim 1, wherein a delay cell is utilized for the at least one functional delay cell which can update the at least one functional delay cells' delay setting in one selected from the group consisting of a single update and a series of incremental updates creating glitches on a clock passing through.

3. The method as claimed in claim 1, wherein a one-fourth cycle delay shift of a clock is achieved.

4. The method as claimed in claim 1, wherein during functional mode the spare delay cell repeats the training sequence continuously to update the spare delay cells one-fourth cycle delay setting while the at least one functional delay cell delays a clock.

5. The method as claimed in claim 4, further including the step of updating the at least one functional delay cell during functional mode at the end of each training sequence of the spare delay cell by dividing the ratio of the at least one functional delay cell into the spare delay cell's updated one-fourth delay setting.

6. The method as claimed in claim 1, wherein a functional delay cell is trained for each clock path.

7. The method as claimed in claim 6, wherein the training is performed in parallel for each delay cell.

8. A computer readable medium having computer-executable instructions for performing a method for process, voltage, and temperature compensation, said method comprising:
   training at least one functional delay cell for a clock path which has a delay setting and training a spare delay cell which has a one-fourth cycle delay setting;
   calculating a ratio for the at least one functional delay cell by dividing the at least one functional delay cells' delay setting into the spare delay cells' one-fourth cycle setting;
   entering a functional mode and switching to a Master-Slave approach.

9. The computer readable medium having computer-executable instructions for performing a method for process, voltage, and temperature compensation as claimed in claim 8, wherein a delay cell is utilized for the at least one functional delay cell which can update the at least one functional delay cells' delay setting in one selected from consisting of a single update and a series of incremental updates creating glitches on a clock passing through.

10. The computer readable medium having computer-executable instructions for performing a method for process, voltage, and temperature compensation as claimed in claim 8, wherein a one-fourth cycle delay shift of a clock is achieved.

11. The computer readable medium having computer-executable instructions for performing a method for process, voltage, and temperature compensation as claimed in claim 8, wherein during functional mode the spare delay cell repeats the training sequence continuously to update the spare delay cells one-fourth cycle delay setting while the at least one functional delay cell delays a clock.

12. The computer readable medium having computer-executable instructions for performing a method for process, voltage, and temperature compensation as claimed in claim 11, wherein the method further includes the step of updating the at least one functional delay cell during functional mode at the end of each training sequence of the spare delay cell by dividing the ratio of the at least one functional delay cell into the spare delay cell's updated one-fourth delay setting.

13. The computer readable medium having computer-executable instructions for performing a method for process, voltage, and temperature compensation as claimed in claim 8, wherein a functional delay cell is trained for each clock path.

14. The computer readable medium having computer-executable instructions for performing a method for process, voltage, and temperature compensation as claimed in claim 13, wherein the training is performed in parallel for each delay cell.

15. A system for process, voltage, and temperature compensation, comprising:
   means for training at least one functional delay cell for a clock path which has a delay setting and training a spare delay cell which has a one-fourth cycle delay setting;
   means for calculating a ratio for the at least one functional delay cell by dividing the at least one functional delay cells' delay setting into the spare delay cells' one-fourth cycle delay setting;
   means for entering a functional mode and switching to a Master-Slave approach.

16. The system for process, voltage, and temperature compensation as claimed in claim 15, wherein a delay cell is utilized for the at least one functional delay cell which can update the at least one functional delay cells' delay setting in one selected from the group consisting of a single update and a series of incremental updates creating glitches on a clock passing through.

17. The system for process, voltage, and temperature compensation as claimed in claim 15, wherein a one-fourth cycle delay shift of a clock is achieved.

18. The system for process, voltage, and temperature compensation as claimed in claim 15, wherein during the functional mode the spare delay cell repeats the training sequence continuously to update the spare delay cells one-fourth cycle delay setting while the at least one functional delay cell delays a clock.

19. The system for process, voltage, and temperature compensation as claimed in claim 18, further comprising means for updating the at least one functional delay cell during functional mode at the end of each training sequence of the spare delay cell by dividing the ratio of the at least one functional delay cell into the spare delay cell's updated one-fourth delay setting.

20. The system for process, voltage, and temperature compensation as claimed in claim 15, wherein a functional delay cell is trained for each for each clock path.

21. The system for process, voltage, and temperature compensation as claimed in claim 20, wherein the training is performed in parallel for each delay cell.

* * * * *